(12) United States Patent  (10) Patent No.: US 7,446,451 B2
Allen et al.  (45) Date of Patent: Nov. 4, 2008

(54) SYSTEMS AND METHODS FOR CONVERTING HEAT TO ELECTRICAL POWER

(75) Inventors: Edward H. Allen, Lancaster, CA (US); Markos Karageorgis, Palmdale, CA (US)

(73) Assignee: Lockheed Martin Corporation, Bethesda, MD (US)

(*) Notice: Subject to any disclaimer, the term of this patent is extended or adjusted under 35 U.S.C. 154(b) by 931 days.

(21) Appl. No.: 10/881,890

(22) Filed: Jun. 29, 2004

(65) Prior Publication Data

US 2005/0284147 A1 Dec. 29, 2005

(51) Int. Cl.
H01L 41/113 (2006.01)
H01L 41/08 (2006.01)
H01L 31/00 (2006.01)

(52) U.S. Cl. .................. 310/311; 310/319; 310/339; 136/253

(58) Field of Classification Search ......... 310/311–371, 310/800; 136/253
See application file for complete search history.

(56) References Cited

U.S. PATENT DOCUMENTS 4,976,606 A * 12/1990 Nelson .................. 431/79
5,503,685 A * 4/1996 Goldstein ............... 136/253
5,510,665 A * 4/1996 Conley .................. 310/303
2002/0011590 A1* 1/2002 Nagashima ............. 252/500

OTHER PUBLICATIONS

Romero, Manual J. and Al-Jassim, Mowafak M.; "Advantages of using piezoelectric quantum structures for photovoltaics", Journal of Applied Physics, vol. 93, No. 1, Jan. 1, 2003.
Nozik, Arthur J.; "Advanced Concepts for Photovoltaic Cells", NCPV and Solar Program Review Meeting 2003, NREL/CD-520-33586, p. 422.

* cited by examiner

Primary Examiner—Thomas M Dougherty
(74) Attorney, Agent, or Firm—Koestner Bertani LLP; Mary Jo Bertani

(57) ABSTRACT

An apparatus includes a thermo-photovoltaic (TPV) material that is capable of generating electrical power from low temperature heat radiation. An electric field generator is coupled to apply an electric field to the TPV material. The strength of the electric field is sufficient to shift the sensitivity of the TPV material to sense lower frequency radiation than the TPV material can sense when the electric field is not applied and to broaden the band of frequencies over which the TPV is effective.

21 Claims, 4 Drawing Sheets

SYSTEMS AND METHODS FOR CONVERTING HEAT TO ELECTRICAL POWER

BACKGROUND

Long-duration, High Altitude Airships (HAA) powered by solar cells have been proposed for both commercial and military applications. For example, station-keeping lighter-than-air HAAs have been proposed to replace cell towers for wireless telephone and data systems. Military applications include telecommunication applications as well as intelligence gathering and radar platforms. In most such applications, long-duration station-keeping is essential. Thus, the airship must be equipped to provide power to operate payloads and on-board systems while simultaneously making headway into the wind in order to hold a fixed geostationary position. Winds at altitude are generally benign, but during brief periods, especially in the higher latitudes, winds can exceed 90 knots for a week or more.

Solar cells have been used to provide power for the airships, however, solar radiation is only available during the day so solar-powered concepts must store energy for use at night and provide sufficient excess storage to react any wind, day or night, storm or calm. Such storage systems are typically heavy, have short cycle life, are complex and unreliable, and/or are depletable.

Blackbody (BB) radiation from the earth is continuous, day and night, with most of the energy in the wave length range from 8 to 40 microns. BB radiation offers a power resource for the airship because the stratospheric temperature is well below the earth's radiation temperature and so the Stefan-Boltzmann Law allows us to produce electrical power via the photovoltaic effect, but limited to $Pwr_{max} = \epsilon \cdot \sigma \cdot (T_e^4 - T_s^4)$ where $\epsilon$ is the emissivity, $\sigma$ the Stefan-Boltzmann constant, $T_e$ the earth's temperature and $T_s$ the temperature of the sink. Assuming the sink temperature is the ambient air temperature at the airships' flight altitude (say, 217° Kelvin at 65,000 ft) and the earth's radiation temperature is 280° Kelvin, the maximum available power is approximately 223 watts per square meter. Note that 'sink temperature' varies a few degrees depending on weather, latitude, climate, etc, and 'radiation temperature' varies between 255° K. and somewhat more than 300° K. in a complex way depending on the terrain or ocean underneath the vehicle, the presence of cloud cover, and other factors. Accordingly, the temperatures given are indicative only.

Power-generating photovoltaic cells are not currently available that can deliver electrical power from such long wavelengths. If such cells could be made, they could potentially supply the high-altitude airship from the earthshine alone, continuously, day and night, without the need for solar cells or electrical energy storage.

In recent years, practitioners have been able shift the wave length of impinging infrared radiation on thermo-photovoltaic cells by means of selective emitters and photon converters with equivalent function. Photon converters (of which selective emitters are a subset) absorb photons over a broad range of energies and emit them over a designer-selected narrow band of energy, conserving energy and entropy so as to comply with the First and Second Laws of Thermodynamics.

Thermo-photovoltaic (TPV) cells convert photons to electrical energy. Generally, a TPV system includes a heat source, a photon converter, and a TPV cell. The photon converter (e.g., 'selective emitter'), through physical (or radiant) contact with the heat source, gains energy, and then re-emits that energy in the form of photons of a selected frequency. These photons are then transmitted to an adjacent solid-state TPV generator and converted into electrical energy. The efficiency of the generator depends primarily upon the Second Law of Thermodynamics (referred to as the 'Landsberg Limit' in current TPV practice) and secondarily upon how well the TPV cell's spectral response and the photon converter's output spectrum are matched. The Landsberg Limit is completely determined by the equivalent temperature differential between the source and the sink:

$$\eta = 1 - \frac{4}{3}\frac{T_s}{T_e} + \frac{1}{3}\frac{T_s^4}{T_e^4}$$

where $T_e$ and $T_s$ are the earthshine radiation temperature and the stratospheric sink temperature respectively. In most applications, then, the Landsberg efficiency is beyond the control of the designer. The match between the converter emission spectrum and the TPV spectral response, then, determines the degree to which the TPV cell can reach the Landsberg Limit.

Generally, TPV cells have a narrow band of response that is higher in frequency than the radiation from earthshine. Photons having too long a wavelength cannot be converted into electrical energy and produce unwanted heat, thereby reducing the operating efficiency of the TPV cell. Photons with too short a wavelength will produce electricity in the TPV cell but carry excess energy that must be dissipated as heat and thus also lowers conversion efficiency. Multi-junction TPV cells (called 'tandem' cells) have been built that are essentially several different kinds of TPV cell placed in series so that the frequencies not absorbed by the first cell, are absorbed in one of the subsequent cells. Tandem cells can theoretically achieve the Landsberg Limit assuming an infinite number of cells in tandem each with an optimum sensitivity to progressively longer wave lengths. Three junction TPV cells have been built and achieve slightly more than ⅓ of the Landsberg Limit.

Quantum Dots (QDs) are very small semiconductor structures (of the order of nanometers or somewhat larger in diameter) surrounded by a material of a wider bandgap so that the ensemble can be utilized as a TPV cell. Bandgap is defined as the minimum energy necessary for an electron to transfer from the valence band into the conduction band, where it moves more freely and is available as electric power. QDs confine electrons and holes in three spatial dimensions and to a very small number of energy levels, depending on their size. A QD is larger than an atom but behaves as if it were one, releasing its trapped electron-hole pair to an adjacent conductor when it captures an incident photon. QDs in this sense emulate TPV junctions, holding onto electron-hole pairs, receiving photons and directing them toward raising electron-hole energy, and finally injecting the pair into a conductor; they are surrogate molecules except on a somewhat larger scale, where their design features can be controlled. A TPV device can be made from QD structures, semi-conductor junctions, or a combination of both, to achieve the same performance.

SUMMARY

In some embodiments, an apparatus includes a thermophotovoltaic (TPV) material that is capable of generating electrical power from conductive or radiative heat. An electric field generator is close-coupled to the TPV material so that a strong electric field can be applied to the TPV material. The strength of the electric field is sufficient to shift the sensitivity of the TPV material to sense lower frequency radiation than the TPV material can sense when the electric field is not applied, thereby substantially broadening the range of frequencies that can be utilized by the TPV material.

BRIEF DESCRIPTION OF THE FIGURES

Embodiments of the present invention may be better understood, and their numerous objects, features, and advantages made apparent to those skilled in the art by referencing the accompanying drawings. The use of the same reference symbols in different drawings indicates similar or identical items.

DETAILED DESCRIPTION

In some embodiments, systems and methods disclosed herein provide the ability to harvest the earth's blackbody radiation, also referred to as "earthshine", at night to provide energy to operate a power consuming device around the clock. Various other embodiments disclosed herein can be used to convert into useful energy the waste heat generated by a device such as a jet engine, laptop computer, a radar, or automobile engine, for more efficient energy consumption and operation. All these devices reject waste heat that can be captured and converted in part to useful work (e.g., electric power) thus cooling the device and increasing its net effective efficiency. The power saved by this recycling strategy can improve the performance of the device, increase its range and endurance, and/or lower the operating costs of the device.

Figure 1:
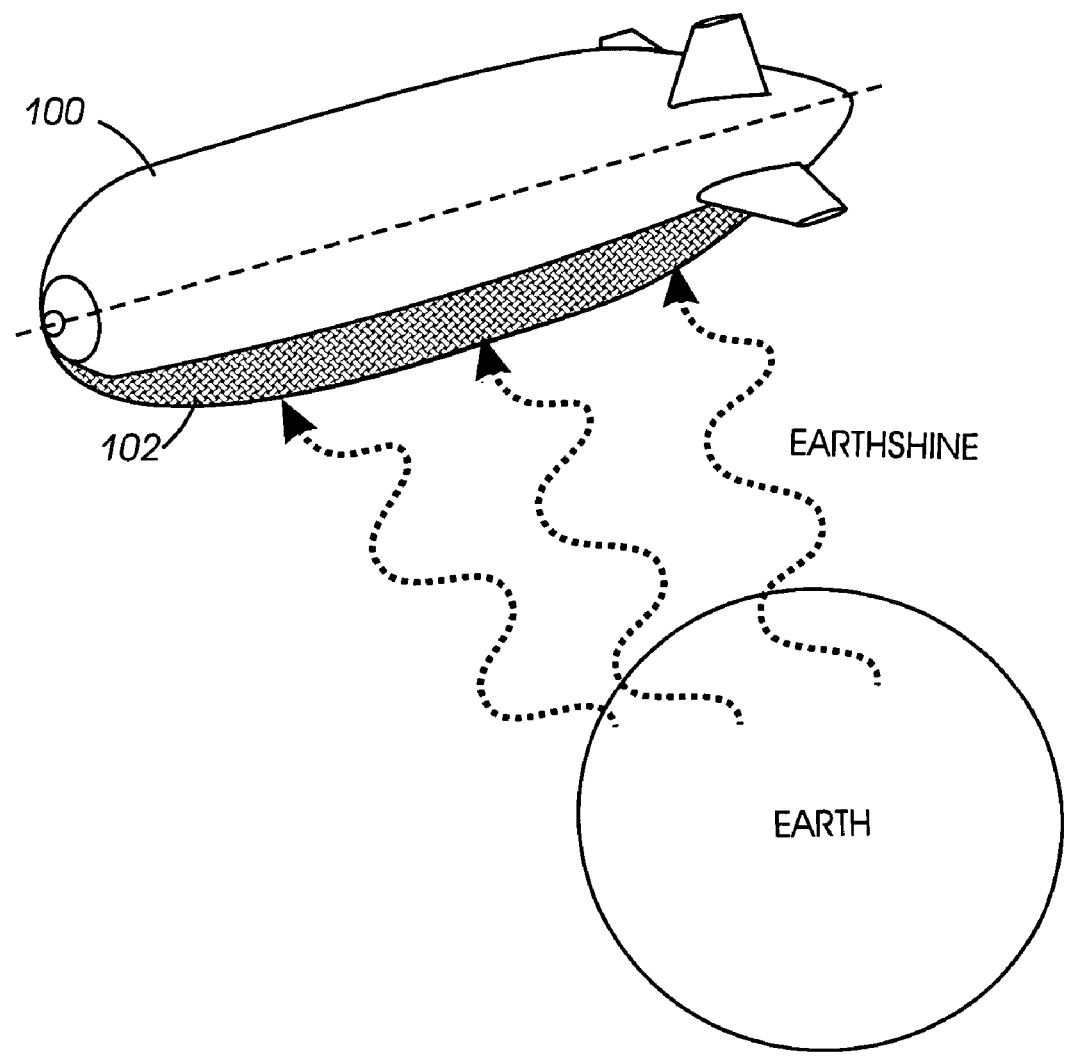
FIG. 1 is a perspective view of an embodiment of an airship configured with Thermophotovoltaic (TPV) fibers capable of converting heat from the Earth's blackbody radiation to electrical power.

Referring to FIG. 1, useful blackbody radiation from the earth at night at 65,000 feet altitude is approximately 223 Watts/meter$^2$ (W/m$^2$). During the day, the output rises manyfold from reflected radiation. In the embodiment shown in FIG. 1, the bottom of airship system 100 incorporates thermophotovoltaic (TPV) material 102 that includes TPV cells, conductors, and electric field application elements. The sensitivity of the TPV cells can be adjusted by subjecting the TPV cells to an electric field to absorb a desired wavelength of infrared emissions, such as earthshine.

For example, TPV cells subjected to an electric field as disclosed herein, and operating at 75% of the Landsberg efficiency limit, can generate 14.5 W/m$^2$. Assuming an airship system 100 with a projected area in the earth's direction covered with TPV cells, the minimum nighttime power production from earthshine is 39 kilowatts (kW) for a 5 million cubic foot vehicle. Such a power level would support a continuous speed rating (referred to as the 'eternal speed') of approximately 43 knots for a typical airship system 100 even if none of the energy generated by the TPV cells is stored. Since the wind at 65,000 feet is typically much less than 43 knots, the excess energy can be stored to operate payloads and other airship functions during high wind events. If the payload does not require much energy, storage is required only for the most stressful wind events, and may not be required at all depending on the system availability requirement. If the airship volume is doubled to 10 million cubic feet, the available power rises to 63 kW, but the eternal speed remains approximately constant because the drag of the vehicle rises with volume almost exactly enough to nullify the increased power output.

Figure 2:
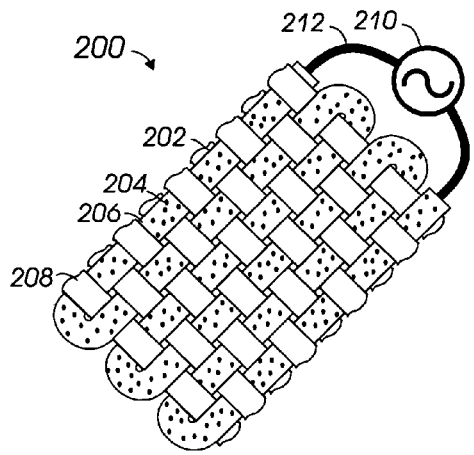
FIG. 2 is a diagram of an embodiment of a woven TPV material configured to provide power to a device.

Referring to FIG. 2, an embodiment of a portion of woven TPV material 200 incorporating TPV fiber 202 is shown. TPV fiber 202 includes one or more TPV cells, shown as QDs 204, embedded in a material capable of generating an electric field, such as piezoelectric material 206. Various types of piezoelectric materials 206 including diverse polymeric structural fibers generate an electric charge when mechanically strained. Strain arises naturally in the material surrounding an airship due to density, pressure, and temperature gradients within and outside airship system 100. Thus, including piezoelectric material 206 in TPV fiber 202 from transforms the potential energy of envelope strain into an electric field for use by the TPV fiber 202 without consuming on-board fuel or other resources.

TPV fiber 202 takes advantage of the Stark effect, which refers to the red shift in, and broadening of, the spectral line structure of a material in the presence of an electric field. At present, QDs 204 can be fabricated that are sensitive to radiation wavelengths up to approximately 8 or 9 microns. Since most of the energy in earthshine has a wavelength of between 8 and 40 microns, the Stark effect can be used to shift the sensitivity of QDs 204 to sense radiation at the longer wavelengths, for example into the region of the earth's radiation.

Any suitable means or combination of means for generating an electric field can be utilized, in addition to, or instead of piezoelectric material 206, such as, for example, capacitors coupled adjacent the TPV cells. Additionally, any suitable TPV cells can be utilized, in addition to, or instead of quantum dots 204, such as, for example, quantum wells, nanowires, and other suitable quantum or non-quantum TPV cell structures.

In some embodiments, polymer materials can be selected for piezoelectric material 206 to achieve TPV fiber 202 with considerable tensile strength. TPV fiber 202 can be woven directly into the structure of a system. For example, woven TPV material 200 can be incorporated into the fabric covering the bottom of the hull of an airship system 100. The ability to incorporate TPV fiber 202 directly into the structure of a device can allow electrical power and strength requirements to be met while simultaneously adding little or no weight to the system. TPV fiber 202 thus provides a distinct advantage over devices with solar cells, which can be heavy, inefficient, and unreliable affixed to the outside of the system.

TPV fibers 202 can be interwoven with other types of structural fibers 208 to form woven TPV material 200. Structural fibers 208 can be any type of suitable material. In some embodiments, structural fibers 208 may have insulating properties to help reduce electromagnetic interference between adjacent TPV fibers 202. Further, the strength and tensile properties of structural fibers 208 can be chosen according to the type of device in which woven TPV material 200 will be utilized. For example, it may be more desirable for woven TPV material 200 to be flexible when incorporated into the hull of airship system 100, however, a more rigid construction may be preferred for other applications, such as automotive, aircraft, or computer-related or electronics-related applications.

Woven TPV material 200 can be configured to supply power to any suitable type of device(s) or component(s), shown symbolically as a load 210 in FIG. 2. Any suitable conductive member can be configured to conduct electricity from the TPV cells to the load 210. In the embodiment shown, a conducting wire 212 is threaded through and extends from the ends of TPV fiber 202 to be coupled to the load 210. A specified length of TPV fiber 202 can be used to provide the required electrical power to the load 210. In some embodiments, two or more segments of TPV fibers 202 can be incorporated in a device and configured to supply power to different and/or the same components in the device.

Additionally, two or more segments of TPV fiber 202 can be electrically isolated from each other to help prevent a complete power outage in the event damage to one segment causes an open circuit condition. In such embodiments, the undamaged segments of TPV fiber 202 can continue to supply power. Further, the cost to replace a damaged segment is likely to be much less than the cost to replace a longer length of TPV fiber 202 to correct an open circuit condition. Open circuit conditions can be easily located using techniques developed by the electric utilities to find faults in transmission lines, and once found, easily repaired with through-hole couplers (not shown).

With regard to airship system 100 in FIG. 1, TPV material 202 can be dedicated to providing continuous power to the base load of the system, leaving other sources of energy, such as fossil fuel or solar cells (if required) to meet the variable power needs of airship system 100 and payloads within airship system 100. Such a configuration can reduce the energy storage requirements, and a wider mix of energy generation and storage technologies can be used to optimize performance and cost-efficiency.

It should be noted that woven TPV material 200 is an example of one form factor for TPV fiber 202, and that other suitable form factors incorporating TPV cells to which a corresponding electric field can be applied can be utilized. Additionally, TPV fiber 202 can have any suitable form factor or combination of form factors including strands, flat sheets, and/or curved sheets.

Figure 3:
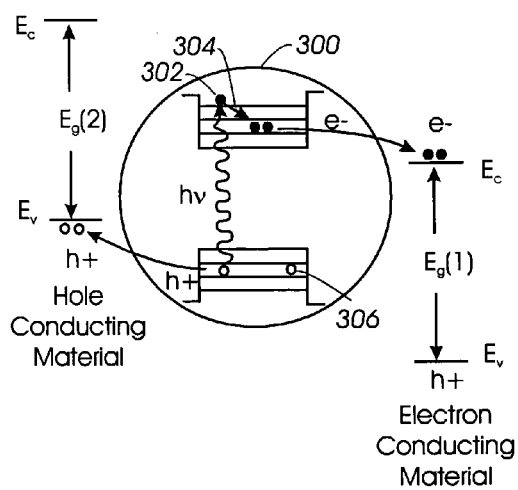
FIG. 3 is a schematic diagram indicating the energy gap in a quantum dot when no electrical field is applied to the quantum dot.

Referring to FIG. 3, a quantum dot 300 is shown with electrons 302 and holes 306. When an incoming photon strikes a TPV cell, such as quantum dot 300, the photon's energy is absorbed by an electron 302, boosting the electron's energy state hv, where h is Planck's constant and v is the frequency of the absorbed photon. If the gap ($E_g$) between the energy of the TPV cell's valence electrons ($E_v$) and the energy of the TPV cell's conduction electrons ($E_c$) is equal to, or smaller than that of the photon, a valence electron (e−) will jump over the gap into the conduction band. If the photon energy exceeds the energy required to jump the band gap $E_g$, an electron 302 is released into the current (e−), but the excess energy causes heat. This phenomenon is illustrated in FIG. 3 by arrow 304 indicating electron 302 transferring from a higher energy level to a lower energy level in quantum dot 300 before being released into the current (e−). If the photon energy is too little, only heat, and no conduction electron, is generated.

Figure 4:
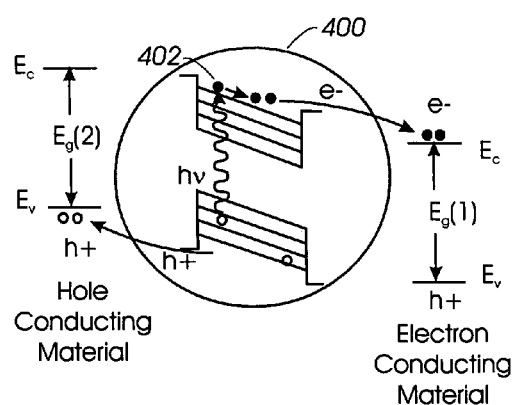
FIG. 4 is a schematic diagram indicating a reduced energy gap in the quantum dot of FIG. 3 when an electrical field is applied to the quantum dot.

Referring now to FIG. 4, the amount of photon energy required for an electron 402 to jump over the band gap $E_g$ into the conduction band can be reduced by exposing a TPV cell, such as quantum dot 400, to an electric field (not shown). The electric field is superposed on the electrical structure of the TPV cell and "tilts" the band gap, effectively reducing the energy required to release electron 402 into the current. Accordingly, the TPV cell can capture lower-energy photons and harvest lower quality (i.e., lower temperature) waste heat. Note that no energy is harvested from the electric field; the electric field is only used to reduce the bandgap over which the electron 402 must jump to get into the conduction band. Thus the electric field is not depleted or diminished in the process of harvesting the lower quality photons.

In some embodiments, TPV fiber 202 can be used to withdraw heat from sections of an engine, such as the compressor section, to reduce the work required of any compressor stages following the point of heat withdrawal. The withdrawn heat can be converted into energy and used to provide power for the engine and/or other components in the device containing the engine. In general, TPV fiber(s) 202 can be used in any application where it would be useful and cost effective to recycle low quality waste heat. Such applications include nearly every device that consumes electric or chemical fuel power, ranging for example, from the heat of the reflectors in directed lamps and flashlights, to the substrates of increasingly higher temperature electronics, to the casings of hot-water heaters, and, indeed, even to the shadow side of solar cells.

Figure 5:
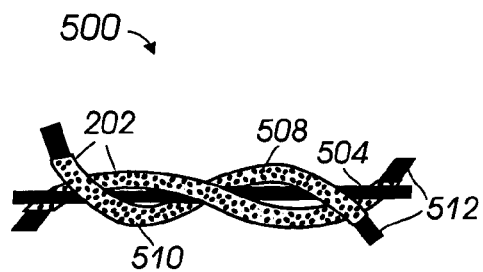
FIG. 5 is a diagram of an embodiment of TPV fibers twisted in a yarn including a special-purpose fiber.

FIG. 5 shows that one or more segments of TPV fiber 202 can be bundled together with one or more special purpose fibers 504 to form a yarn 506. In the embodiment shown, quantum dots 508 are embedded in thin film of piezoelectric material 510 that coats conductive filaments 512. Piezoelectric material 506 can be a polymer fiber, such as polyvinylidene fluoride (PVDF) film that insulates conductive filament 512 and quantum dots 508 from other TPV fibers 202. Special-purpose fiber 504 can be any suitable material, such as a carbon fiber thread, that lends the desired amount of strength and flexibility. Special-purpose fiber 504 can also be configured with sensors and/or other components to perform a wide array of functions, such as sensing and communication functions. Such components can be nanostructure devices and/or any other suitable types of devices.

Figure 6:
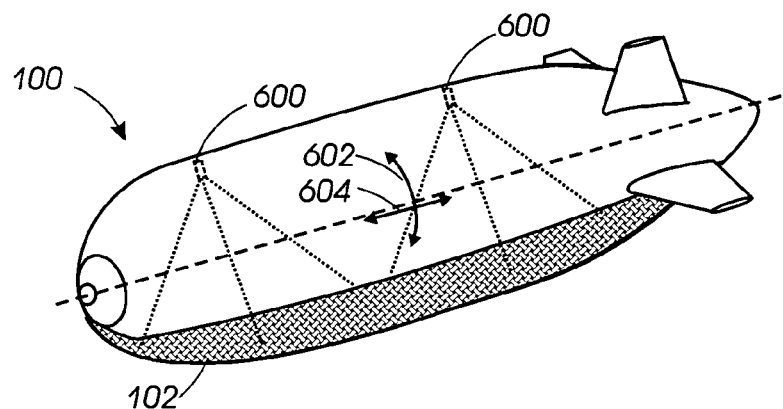
FIG. 6 is a perspective view of an embodiment of an airship configured with an electric field actuation system.

Referring now to FIG. 6, another embodiment of airship system 100 is shown including one or more actuating systems 600 that can be used to modulate current flowing through TPV material 102 directly by imposing an additional external electric field or indirectly by means of deforming the piezoelectric material 206 (FIG. 2) incorporated in TPV material 102. Note that piezoelectric material 206 can be deformed using any suitable actuating system 600, for example, piezoelectric material 206 can be deformed by dynamic stress variations, perhaps energized from ultrasonic sources, shown symbolically as arrows representing hoop stress 602 and longitudinal stress 604, arising from bending and elastic modes. Additionally, pressure fluctuations originating in the turbulent boundary layer over the surface of airship system 100 can advantageously be used to deform piezoelectric material 206 and modulate the electrical field. Actuating systems 600 can accordingly be used as an adjunct mechanism to deform piezoelectric material 206 based on power requirements. Any suitable type of actuating system 600 can be utilized to modulate the current including various types of lasers, masers, ultrasonic beams, and/or any other system that generates energy beams that can be used to accelerate or decelerate electrons.

Figure 7:
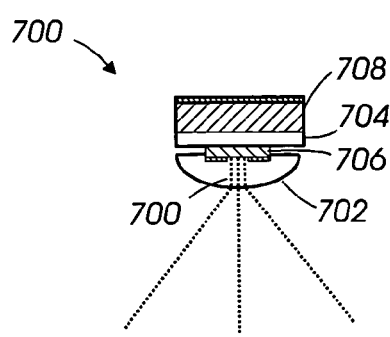
FIG. 7 is a cross-sectional side view of a Vertical Cavity Surface Emitting Laser (VCSEL) that can be used to deform piezoelectric material to modulate the piezoelectric field.

FIG. 7 shows a cross-sectional view of an example of a VCSEL 700 that can be utilized as an actuating system 600 to modulate the current flow in TPV material 102. VCSEL 700 can be operated to direct a beam of light energy to energize a desired portion of piezoelectric material 206 (FIG. 2). An electrical field is generated as piezoelectric material 206 deforms under the energy absorbed, as well as when the energy beam is removed and piezoelectric material 206 relaxes to ambient temperature. If current is flowing through TPV material 102, the energy beam in a local region of the piezoelectric material 206 will modulate the electric field applied by the piezoelectric material 206 to the TPV material 102 and thus modulate the flow of current in the TPV material 102. This modulation can be used to extract radio-frequency (RF) energy that radiates from the excited region of the TPV material 102. Thus, a localized region of the TPV material 102 can be made to radiate RF waves as an antenna. By appropriate regulation, localization, and control of the excitation energy impinging on the TPV material 102, the entire envelope or any portion of it can be made to radiate as an active array antenna. An advantage of such an antenna is that it can be constructed, virtually, on the surface of airship system 100 without any wiring to carry power or signals to the active elements on the array. Such an antenna can also be rapidly adjusted to whatever shape, form, or size optimizes the intended functional and frequency requirements.

VCSEL 700 includes semiconductor layers that emit low-divergence light beams 700 perpendicular to their p-n junction. A curved lens 702 can be placed over the emission area to refract light beams 700 over a wider area. VCSEL 700 usually includes an active (gain) region 704 between two distributed Bragg reflector (DBR) mirrors 706, 708. The DBR mirrors 706, 708 of a typical VCSEL 700 can be constructed from dielectric or semiconductor layers (or a combination of both, including metal mirror sections). Other types of VCSELs can include active region 704 between metal mirrors. The area between the mirrors 706, 708 is often referred to as a resonator. The exit mirror 706 typically has a lower reflectivity than the other mirror 708.

Figure 8:
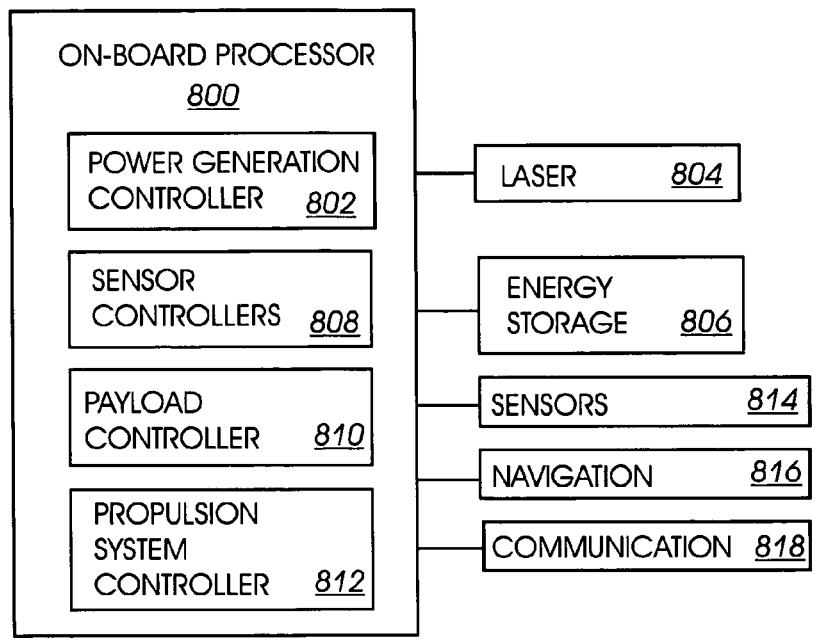
FIG. 8 is a diagram of an embodiment of an on-board processing system that can be included in a device that incorporates TPV fibers.

Referring to FIG. 8, an embodiment of an on-board processing system 800 that can be included in a device, such as airship system 100 (FIGS. 1 and 6), that incorporates TPV fibers 202 is shown. Power generation controller 802 can be included in processing system 800 to determine the power requirements of the device, and to operate the actuation system 600 (shown as laser subsystem 804) to generate an electrical field for the TPV cells based on the reserve power available in energy storage subsystem 806 and the power that can be provided by TPV fibers 202. Several additional components are shown in processing system 800 that can optionally be included in a particular device, such as sensor controllers 808, payload controller 810, and propulsion system controller 812, which can be used to operate sensor subsystems 814, navigation subsystems 816, and, communication subsystems 818 that require power during operation. The power required to operate components of processing system 800 and subsystems 804, 806, 814, 816, 818 can be supplied by current generated by TPV fibers 202.

Components in processing system 800 can be embodied in any suitable computing device(s) using any suitable combination of firmware, software, and/or hardware, such as microprocessors, Field Programmable Gate Arrays (FPGAs), Application Specific Integrated Circuit (ASICs), or other suitable devices.

Figure 9:
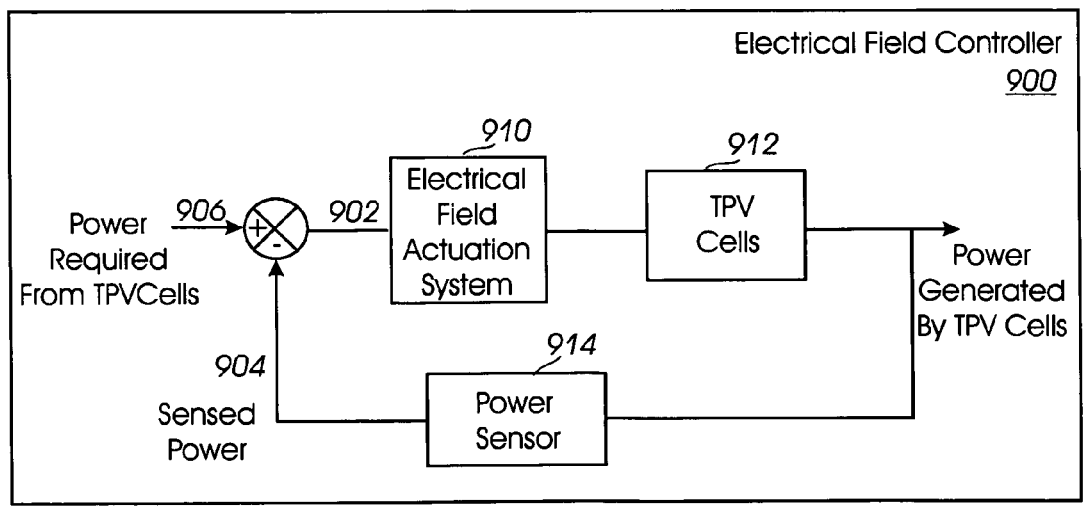
FIG. 9 is a diagram of an embodiment of an electrical field controller that can be used to adjust the electric field applied to the TPV fibers based on power requirements.

An embodiment of an electric field controller 900 that can be included in power generation controller 802 to modulate the current in TPV fibers 202 is shown in FIG. 9. An error signal 902 representing a sensed power signal 904 subtracted from a power required from TPV material signal 906 is provided to electric field actuation system 910. Electric field actuation system 910 can include a gain value that converts the error signal 902 to a command signal that drives the actuation system to generate an electrical field that is applied to TPV cells 912. The actual power generated by the TPV cells 912 is measured by power sensor 914, which outputs the sensed power signal 904.

Electrical field actuation system 910 can be any suitable mechanism or combination of mechanisms capable of modulating the electrical field, such as by activating and deactivating laser subsystem 804 (FIG. 8) to deform a piezoelectric material 204 (FIG. 2) surrounding TPV cells 912; and/or to charge and discharge capacitors adjacent to TPV cells 912, for example. Note that when TPV cells 912 are generating the power required, the error signal 902 will be zero, and the actuation system 910 will not generate an electrical field. Such conditions can occur during daytime or in gusty wind conditions that cause surface deformations in piezoelectric field 204. Additional logic can be included in power generation controller 802 (FIG. 8) to store excess power in energy storage subsystem 806 (FIG. 8) when power generated by TPV cells 912 is greater than the power required.

Referring again to FIG. 8, sensor controllers 808 can include logic instructions to operate various types of sensor subsystems 814, such as Forward Looking Infrared (FLIR) sensors; RADAR; and motion dynamics sensors that provide information regarding attitude, position, speed, acceleration, and/or ambient air temperature, for example. Sensor subsystems 814 can be embedded in TPV fibers 202 and/or special-purpose fibers 504 (FIG. 5), based on the capabilities required for device in which the fibers 202, 504 are utilized.

Payload controller 810 can be included in on-board processor 800 to operate one or more payloads. Payload controller 810 can provide power requirements to operate the payload(s) to power generation controller 802, ensure that enough power is available to operate the payload as well as the base functions of the device carrying the payload.

Propulsion system controller 812 can be included in on-board processor 800 to operate one or more engines, including a fuel management system. Propulsion controller 812 can provide power requirements to operate the engines to power generation controller 802, to ensure that enough power is available to operate the propulsion system as well as other functions performed by the device in which the propulsion system is installed.

Navigation subsystems 816 can include a variety of subsystems that determine the device's relative bearing and slant range distance to a ground station; keep the device's present position and update the present position being kept by one or more other sources, such as an inertial navigation system (INS) and/or a Global Positioning System (GPS) to provide highly accurate present position and velocity data. The GPS is a space satellite based radio navigation system that provides continuous, all weather, passive operation to an unlimited number of users anywhere on the earth. Navigation subsystems 816 can also include an Attitude Heading Reference System (AHRS), which is a self-contained attitude reference system that provides backup pitch, heading, and roll attitude for use by other subsystems.

Communication subsystems 818 can interface with on-board processing system 800 to provide information to and from other components in on-board processing system 800.

Any suitable type of communication subsystem 818 can be included, such as a satellite communication system, data link, and high frequency radio systems, among others.

Other suitable components can be utilized in and interface to on-board processing system 800, in addition to, or instead of, the components mentioned herein, depending on the type of device in which the TPV cells 912 (FIG. 9) are incorporated.

Solid-state electrical generating devices, such as TPV fiber 202, can be integrated into a variety of devices where relatively substantial sources of excess heat can be made available, such as jet engines and laptop computers. These solid-state devices are similar to thin films and have no moving parts, and can be integrated into nozzles, combustion chambers, liners, and insulators. For example, the hot sections of jet engines operate at less than 50% Carnôt efficiency, often much less, principally because of limitations on temperatures of their constituent materials. This implies that at least half the power-producing value of the fuel is exhausted into the wake behind the vehicle, and so represents a huge resource for recycling and re-use. Integrating solid state technologies, such as TPV fiber 202, into such devices can recapture a substantial portion of this waste energy. If used to boost performance, range and endurance could double, in the limit. If used to drive other equipment or payloads, these other devices could be integrated with much less impact on performance.

While the present disclosure describes various embodiments, these embodiments are to be understood as illustrative and do not limit the claim scope. Many variations, modifications, additions and improvements of the described embodiments are possible. For example, those having ordinary skill in the art will readily implement the processes necessary to provide the structures and methods disclosed herein. Variations and modifications of the embodiments disclosed herein may also be made while remaining within the scope of the following claims. The functionality and combinations of functionality of the individual modules can be any appropriate functionality. In the claims, unless otherwise indicated the article "a" is to refer to "one or more than one".

We claim:

1. An apparatus comprising:
   a thermo-photovoltaic (TPV) fiber configured to generate electrical power from heat radiation; and
   an electric field generator coupled to apply an electric field to the TPV fiber, wherein the strength of the electric field is sufficient to shift the sensitivity of the TPV fiber to sense lower frequency radiation than the TPV fiber can sense when the electric field is not applied and to broaden the range of frequencies over which the TPV fiber is sensitive.

2. The apparatus of claim 1, wherein the electric field generator includes a piezoelectric material.

3. The apparatus of claim 1, wherein the electric field generator includes at least one of a capacitor and an electrode.

4. The apparatus of claim 1, wherein the TPV fiber includes quantum structures.

5. The apparatus of claim 2, further comprising an actuating system configured to modulate the current flowing through the TPV fiber.

6. The apparatus of claim 5, wherein the actuating system generates an energy beam.

7. The apparatus of claim 6, wherein the energy beam is generated by a laser.

8. The apparatus of claim 6, wherein the energy beam is generated by a maser.

9. The apparatus of claim 6, wherein the energy beam is ultrasonic.

10. The apparatus of claim 1, further comprising a power generation controller coupled to the electric field generator, wherein the power generation controller is configured to receive signals representing the electrical power generated by the TPV fiber and to adjust the electric field generator based on power required.

11. The apparatus of claim 1, further comprising an energy storage facility configured to store excess energy from the TPV fiber.

12. The apparatus of claim 1, further comprising a special-purpose fiber interwoven with the TPV fiber, wherein the special-purpose fiber provides desired structural capabilities.

13. The apparatus of claim 1, further comprising a special-purpose fiber interwoven with the TPV fiber, wherein the special-purpose fiber includes a sensor component.

14. The apparatus of claim 1, further comprising an electrically conductive filament threaded through the TPV fiber.

15. The apparatus of claim 1, further comprising a plurality of TPV fiber segments, wherein each TPV fiber segment can be configured to provide power independently of the other TPV fiber segments.

16. The apparatus of claim 6, wherein the energy beam is applied to the TPV fiber to generate radio frequency (RF) waves and to impose a signal on the RF waves.

17. The apparatus of claim 1, further comprising:
    an airship system, the TPV fiber is incorporated into fabric covering at least a portion of the airship system.

18. The apparatus of claim 1, further comprising the TPV fiber is interwoven with another fiber that has insulating properties to help reduce electromagnetic interference between adjacent TPV fibers.

19. The apparatus of claim 1, further comprising at least two segments of TPV fibers are incorporated in a device and configured to supply power to a component in the device.

20. The apparatus of claim 1, further comprising at least two segments of the TPV fiber electrically isolated from each other so that power remains available in the event that damage to one segment causes an open circuit condition.

21. The apparatus of claim 1, further comprising:
    an engine, at least a portion of the engine is configured with the TPV fiber, the TPV fiber is used to withdraw heat from sections of an engine to reduce the work required of any compressor stages following the point of heat withdrawal.

* * * * *